RING-COUNTER UTILIZING CAPACITANCE-DIODE NETWORK IN COUPLING AND IN FEEDBACK CIRCUITS FOR WIDE FREQUENCY RANGE OPERATION

Filed Dec. 31, 1962

INVENTOR
JOHN R. DURIO JR.
BY Moody and Phillips
ATTORNEYS 3,181,011

RING-COUNTER UTILIZING CAPACITANCE-DIODE NETWORK IN COUPLING AND IN FEEDBACK CIRCUITS FOR WIDE FREQUENCY RANGE OPERATION

John R. Durio, Jr., Costa Mesa, Calif., assignor to Collins Radio Company, Cedar Rapids, Iowa, a corporation of Iowa Filed Dec. 31, 1962, Ser. No. 248,396
4 Claims. (Cl. 307—88.5)

This invention relates, generally, to transistorized ring-counter circuits and, more particularly, to a transistorized ring-counter circuit which will operate reliably over a wide range of input signal frequencies.

In many transistorized ring-counter circuits the collector electrode of the operating transmitter of each stage is coupled to the base electrode of the operating transistor of the next following stage through a coupling capacitor, with the collector of the last stage transistor being coupled to the base of the first transistor to complete the counting ring. Assuming that NPN transistors are being employed, stepping or counting can be accomplished by supplying a negative pulse simultaneously to each of the base electrodes of all the transistors in the counting ring. The particular transistor which was conductive when the counting pulse was applied, will become nonconductive thereby. The collector electrode potential of the newly nonconductive transistor will rise sharply and will be impressed through the coupling capacitor to the base electrode of the next succeeding transistor, to cause said next succeeding transistor to become conductive, thus advancing the count by "1." The foregoing principles are well known in the art. It is also well known that certain limitations on the speed of operation are inherent in the foregoing structure. Such limitations exist both at the lower and upper ends of the operating frequency band. More specifically, the said next succeeding transistor will remain conductive ordinarily only until the coupling capacitor discharges to the point where the potential of the base electrode of said succeeding transistor can no longer maintain conduction therein. Thus, the lower operating frequency limit is determined primarily by the RC time constants in the coupling circuit between adjacent transistors.

The upper operating frequency limit is determined by the recovery time of each of the transistors. More specifically, when a particular transistor suddenly becomes conductive, two conditions are created which tend to limit the upper frequency of operation. The first condition is that the decreasing collector potential of the newly conductive transistor will tend to increase the cut-off biasing potential on the base electrode of the next succeeding transistor. Thus, a longer period of time is required to raise the potential of the base electrode of the next succeeding transistor to the point of conductivity upon reception of the next input pulse.

The second condition limiting the upper operating frequency exists since a finite amount of time is required for a transistor to become nonconductive. More specifically, due to RC time constants inherent in the circuit, a finite amount of time is required for an input pulse to drive the potential of the base of the conductive transistor into the nonconductive region.

An object of the present invention is to provide a transistorized counting ring circuit which will operate over a large frequency range.

A second aim of the invention is a transistorized counting ring circuit wherein the upper limit of operating frequency is increased.

A third purpose of the invention is a transistorized counting circuit wherein the lower limit of operating frequency is decreased.

A fourth purpose of the invention is the improvement of transistorized counting rings, generally.

In accordance with the invention there is provided a plurality of operating transistors, one for each stage of the counting ring. Between the collector electrode of each transistor and the base electrode of the next succeeding transistor in the ring, there is provided a series combination of a capacitor and a diode; the said diode being poled to block any pulse presented thereto by the collector of the preceding transistor, which will tend to drive the base potential of the succeeding transistor farther into the nonconductive region. Also provided between the collector electrode of each operating transistor and the base electrode of the preceding operating transistor is a second circuit comprised of the series arrangement of a second diode and a second capacitor, with the diode being poled to supply the negative excursion of the collector potential of a newly conductive transistor back to the base of the preceding transistor, which has just become nonconductive, thus hastening the condition of nonconductivity in the preceding transistor. Also provided are a plurality of locking transistors which can be of the PNP type. Each of said locking transistors is associated with an individual operating transistor, with the base electrode of each locking transistor being connected through an impedance to the collector of the associated operating transistor, and the base electrode of each operating transistor being connected to the collector electrode of the associated locking transistor. Thus, a short time interval after an operating transistor becomes conductive, the collector electrode thereof will become negative to cause the associated locking transistor to become conductive. When the locking transistor becomes conductive, the collector electrode potential thereof will become positive to maintain conductivity of the associated operating transistor.

The aforementioned and other objects and features of the invention will be more clearly understood from the following detailed description thereof when read in conjunction with the drawings in which.

Figure 1:
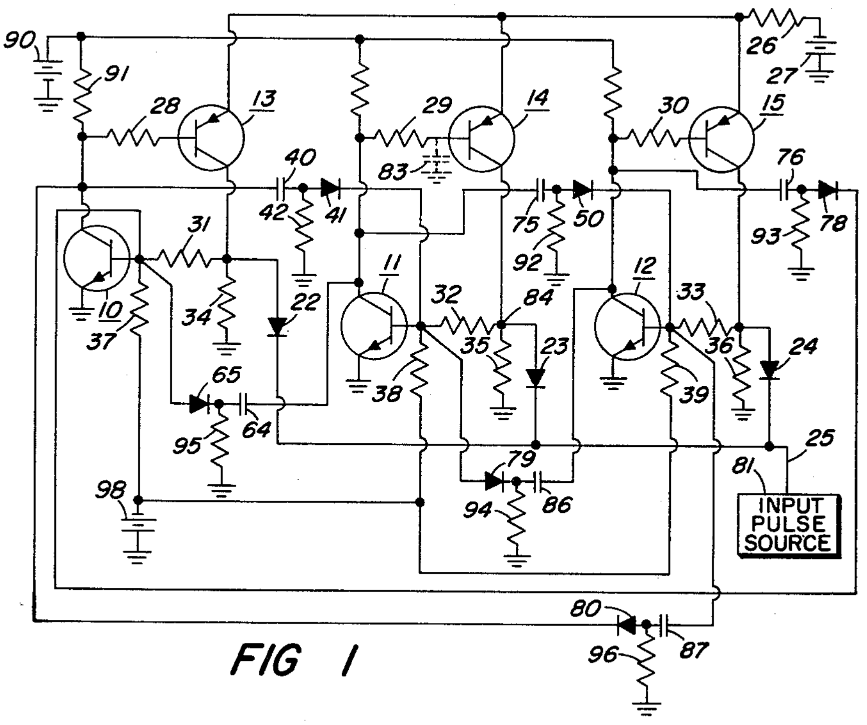
FIG. 1 is a schematic diagram of the invention.
Figures 2, 3, 4, 5:
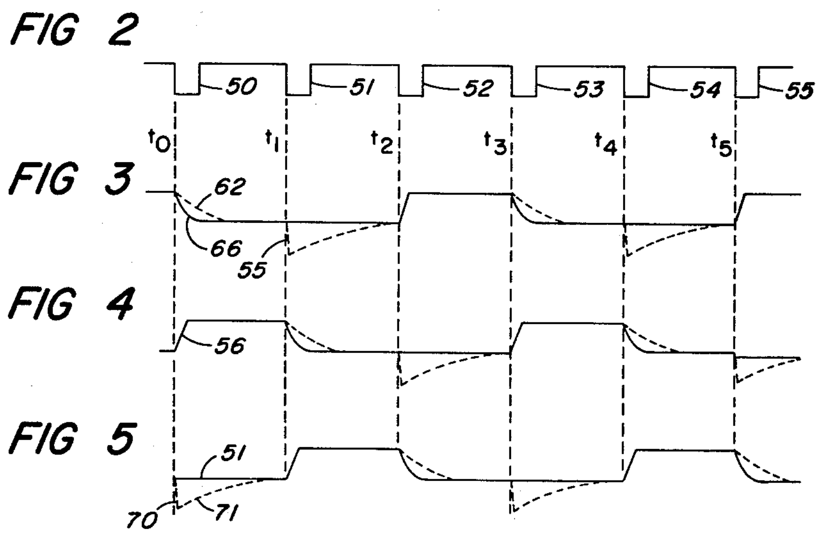
FIG. 2 is a waveform showing the input signal.

FIGS. 3, 4, and 5 show the voltage waveforms of the base electrodes of the three operating transistors in three-stage counter of FIG. 1.

Referring now to FIG. 1, each of the three stages of the counter shown therein is comprised of two transistors: an operating transistor and a locking transistor. Specifically, stage one consists of operating transistor 10 and locking transistor 13; stage two is comprised of operating transistor 11 and locking transistor 14; and stage three is comprised of operating transistor 12 and locking transistor 15. The actual steps of counting are performed by the operating transistors 10, 11, and 12. One operating transistor is always in a conductive condition, with the state of conductivity being advanced, or transferred, to the next succeeding operating transistor with each succeeding input pulse supplied to the input lead 25. As indicated hereinbefore, such counting or transferring of conductivity is accomplished by supplying the sudden increase in collector potential of a newly cut-off transistor through a coupling capacitor to the base electrode of the next succeeding transistor to cause said succeeding transistor to become conductive. In FIG. 1 such coupling capacitors are identified by reference characters 40, 75, and 76 which couple collector electrodes of transistors 10, 11, and 12 to the base electrodes of succeeding transistors 11, 12, and 10, respectively. Such transfer means, however, is obviously limited in that the coupling capacitors can maintain a positive voltage only for a given time interval, determined by the RC time constant of the circuit. After the expiration of said time interval, the conductive transistor would be cut off, in the absence of any other means for maintaining said operating transistor in a conductive condition.

It is a function of each of the locking transistors 13, 14, and 15 to provide a locking circuit for its associated operating transistor and to maintain said operating transistor in a conductive state indefinitely or until the next input pulse is supplied to the counter circuit.

However, as indicated above, the locking transistors 13, 14, and 15 do not become active in the circuit until the frequency of the applied input pulses decreases below a predetermined rate whereat the RC time constant of the relevant transfer circuit is insufficient to maintain the conductivity of an operating transistor. Such function will be described in more detail later herein.

While the diodes 41, 50, 78, 65, 79, and 80 comprise an important part of this invention, a general discussion of the circuit of FIG. 1 will be made before describing the specific effects of the aforementioned diodes, in order to facilitate understanding of the invention.

Assume that high frequency pulses, for example, of the order of one-tenth of a microsecond, are supplied to the input lead 25 from source 81. Assume, further, that operating transistor 10 is conductive. With such high frequency pulses the lockout transistors 13, 14, and 15 do not form an active part of the circuit.

Each of the input pulses or clock pulses is supplied through the diodes 22, 23, and 24, simultaneously, to the base electrodes of operating transistors 10, 11, and 12. Since, under the assumed conditions, the transistors 11 and 12 are already in a nonconductive state, no direct effect will be had thereon by the next negative clock pulse that occurs. However, said next received negative clock pulse will cause transistor 10 to become nonconductive, thus abruptly raising the collector potential of transistor 10. The increase in collector potential is supplied to the base of transistor 11 through coupling capacitor 40 and diode 41, which is poled to permit only the passage of a positive pulse. Such positive pulse will cause the transistor 11 to become conductive. The right-hand plate of capacitor 40, which has now acquired a positive potential, will charge in a negative direction through resistor 42 to ground and also through resistor 38 to negative biasing battery 98. In addition to the charging paths set forth above, the right-hand plate of capacitor 40 will experience some negative charging through resistor 32 and diode 23 from the clock pulse source 81, but only during the existence of the clock pulse.

Under the assumed conditions wherein the input clock pulse repetition rate is high, insufficient time exists between adjacent clock pulses for any of the locking transistors 13, 14, or 15 to become conductive. The specific reason the locking transistors do not become conductive is because a finite time interval, due to an RC circuit, is required for the potential of the base electrode of a locking transistor to decrease to a point where conductivity will occur. For example, between the base electrode of locking transistor 14 and ground, exists an inherent capacitance 83. Such inherent capacitance introduces an RC time constant which delays the decrease in base potential of locking transistor 14 when the operating transistor 11 becomes conductive.

As the clock pulse repetition rate is decreased, the RC time constant of capacitor 40 and its various discharge paths would eventually become less than the period of the pulse rate. Under such circumstances the conductive operating transistor would become nonconductive before the transistor of the next subsequent stage is fired, with the result that the transistor ring would become inoperative. To prevent such occurrence, locking transistors 13, 14, and 15 are provided. More specifically, before the capacitor 40 discharges below the value necessary to keep transistor 11 conductive, the locking transistor 14 will become conductive due to the decrease in collector potential of newly conductive transistor 11, which potential decrease is supplied through resistor 29 to the base of the locking transistor 14. Once conductive, the current through locking transistor 14 will flow from positive battery source 27, through resistor 26, transistor 14, resistor 32, and base biasing resistor 38, to negative battery source 98. Thus, resistors 38 and 22 and the transistor 14 form a voltage divider which maintains the potential of the base of transistor 11 at a conductive level.

It should be noted, however, that if the clock pulse is too long it will eventually cause the transistor 11 to become nonconductive even though the locking transistor 14 has become conductive. The aforementioned failure will occur in the following manner. In the absence of a negative input pulse, there will be no discharge through diode 23, and the voltage drop across resistor 26, transistor 14, and resistor 32 will be insufficient to cause the transistor 11 to become nonconductive, even if the right-hand plate of capacitor 40 becomes completely discharged to ground potential. However, if an additional current drain is caused to flow through resistor 26 and transistor 14 as a result of the presence of a negative input clock pulse, the potential of the junction 84 will decrease to a point where the base potential of transistor 11 can no longer be maintained at a sufficiently high level to sustain conductivity in transistor 11.

Thus, there is established an upper limit on the time duration of the clock pulse; such upper limit being in the neighborhood of .7 or .8 of a microsecond with the circuit shown in FIG. 1 and having the component values as set forth hereinafter. If the clocking pulse is less than .7 or .8 microsecond, then the locking transistor 14, in conjunction with resistors 32 and 33, will operate to maintain the potential of the base of transistor 11 at a conductive level.

Returning now to a further consideration of the upper operating frequency limits of the circuit of FIG. 1, two principal factors are involved in creating such a limitation. Firstly, when a transistor, such as transistor 11, becomes conductive, the decrease in collector potential thereof will, in the absence of the signal carry-forward diode 50, be passed through coupling capacitor 75 to the base of the next succeeding operating transistor 12 to drive said transistor 12 further into nonconductivity. The presence of the carry-forward diode 50, however, prevents the passage of such a negative pulse to the base of transistor 12. The second limiting factor is that a transistor will require a finite amount of time to become completely cut off. More specifically, when transistor 10 is being cut off by a negative impulse from source 81, a finite amount of time will be required for the base of transistor 10 to become sufficiently negative to completely cut off the transistor 10. A signal carry-back circuit, including capacitor 64 and diode 65, functions to feed the negative pulse appearing at the collector of newly conductive transistor 11 back to the base of the transistor 10, thus hastening the cut-off process.

Referring now to FIGS. 3, 4, and 5, there is shown the voltage waveforms of the bases of transistors 10, 11, and 12, respectively, which illustrate in detail the functions of the carry-forward diodes 41, 50, 78, and the carry-backward diodes 65, 79, and 80. Starting at time $t_0$, assume that the transistor 10 has just cut off, as discussed above, and that transistor 11 is just becoming conductive, with the base electrode thereof having the rising waveform 56 of FIG. 4. As transistor 11 becomes increasingly conductive the collector electrode potential thereof will become increasingly negative and, in the absence of diode 50, would drive the base of transistor 12 in a negative direction as shown by the dotted portion 70 of the curve of FIG. 5. However, because of the blocking effect of diode 50, the negative excursion of the collector potential of the transistor 11 will not be impressed upon the base of transistor 12, and the base potential of transistor 12 will remain at the level indicated by the solid line 51 of FIG. 5. Thus, less time will be required to cause said transistor 12 to become conductive when the next negative input pulse is supplied to the circuit.

A separate carry-forward circuit exists between each of the three stages of the circuit to form a complete ring. More specifically, the carry-forward circuit comprised of capacitor 76 and diode 78 couples the collector of transistor 12 to the base of transistor 10, and the carry-forward circuit comprised of capacitor 40 and diode 41 couples the collector of transistor 10 to the base of transistor 11.

Returning again to the condition of the circuit immediately after time $t_0$ it will be seen from FIG. 3, which represents the base potential of transistor 10, that two alternate curved portions 66 and 62 are shown. The dotted portion 62 represents the decrease in the potential of the base of transistor 10 when the negative input pulse 50 is supplied to the circuit, in the absence of the coupling circuit comprised of diode 65 and capacitor 64. However, with the addition of diode 65 and capacitor 64 the negative-going signal appearing on the collector of newly conductive transistor 11 is supplied back to the base of transistor 10 to speed up the cutoff, as represented by the portion 66 of the curve of FIG. 3. It is desirable to have the transistor 10 cut off as quickly as possible since such rapid cutoff will result in a more rapid increase of the collector potential thereof, thus hasten the turning on of transistor 11.

Similarly carry-back or feedback coupling circuits are provided between operating transistors 12 and 11, and operating transistors 10 and 12. More specifically, carry-back coupling circuit comprised of capacitor 86 and diode 79 couples the collector of transistor 12 back to the base of transistor 11, and carry-back circuit comprised of capacitor 87 and diode 80 couple the collector of transistor 10 back to the base of transistor 12.

In one preferred embodiment of the invention the following circuit component values can be employed:

| | | |
|---|---|---|
| R91 | ohms | 6,800 |
| R26 | do | 1,800 |
| R28 | do | 22,000 |
| R29 | do | 22,000 |
| R30 | do | 22,000 |
| R31 | do | 4,700 |
| R32 | do | 4,700 |
| R33 | do | 4,700 |
| R42 | do | 15,000 |
| R92 | do | 15,000 |
| R93 | do | 15,000 |
| R34 | do | 4,700 |
| R35 | do | 4,700 |
| R36 | do | 4,700 |
| R37 | do | 22,000 |
| R38 | do | 22,000 |
| R39 | do | 22,000 |
| R94 | do | 15,000 |
| R95 | do | 15,000 |
| R96 | do | 15,000 |
| C40 | pf | 100 |
| C75 | pf | 100 |
| C76 | pf | 100 |
| C64 | pf | 100 |
| C86 | pf | 100 |
| C87 | pf | 100 |
| E90 | v | +6 |
| E27 | v | +6 |
| E98 | v | −3 |

Diodes 41, 50, 78, 22, 23, 24, 25, 79 and 80 are the type IN663, manufactured by Fairchild Camera & Instrument Co., a corporation of the State of Delaware.

Transistors 10, 11, and 12 are of the type 2N709, and transistors 13, 14, and 15 are of the type 2N996, manufactured by Fairchild Camera & Instrument Co., a corporation of the State of Delaware.

Although in FIG. 1 operating transistors 10, 11, and 12 have been shown as NPN type transistors and locking transistors 13, 14, and 15, as PNP type transistors, it is possible to employ PNP transistors as operating transistors 10 through 12 and NPN transistors as locking transistors 13 through 15. Under such an arrangement positive clock pulses instead of negative clock pulses would be employed to the counting circuit from source 81, and the polarities of the diodes 41, 50, 78, 65, 79, 80, 22, 23, and 24 would be reversed.

It is to be understood that the forms of the invention shown and described herein are but preferred embodiments thereof and that various changes may be made therein without departing from the spirit or the scope of the invention.

I claim:

1. In a ring-counter including a plurality of stages, each stage including an operating transistor comprising a base electrode and a collector electrode, said ring-counter being constructed to cause only one operating transistor to be conductive at a given time with the condition of conductivity being passed to succeeding operating transistors in response to each input pulse, a plurality of coupling means each including the series arrangement of first capacitor means and first diode means connecting the collector electrode of each operating transistor to the base electrode of the next succeeding operating transistor, said first diode means being poled to pass only pulses having a polarity which will tend to cause said next succeeding operating transistor to become conductive, means for supplying input pulses simultaneously to all said operating transistors to cause the conductive operating transistor to become nonconductive, said coupling means responsive to the change in polarity of the collector electrode of the newly nonconductive transistor to supply to the base electrode of the next succeeding operating transistor a signal of a polarity and amplitude to cause said next succeeding operating transistor to become conductive, a plurality of feedback circuits, each feedback circuit comprising second capacitor means and second diode means and connecting the collector electrode of each individual operating transistor back to the base electrode of the immediately preceding operating transistor, said second diode means being poled and biased to pass pulses of a polarity which will tend to cut off said immediately preceding operating transistor.

2. In a ring-counter including a plurality of stages, each stage including an operating transistor comprising a base electrode and a collector electrode, said ring-counter being constructed to cause only one operating transistor to be conductive at a given time with the condition of conductivity being passed to succeeding operating transistors in response to each input pulse, means for supplying input pulses simultaneously to said operating transistors to cause the conductive operating transistor to become nonconductive, a plurality of coupling means each including first nonlinear circuit means connecting the collector electrode of each operating transistor to the base electrode of the next succeeding operating transistor, said nonlinear circuit means being constructed to pass only pulses having a polarity which will tend to cause said next succeeding operating transistor to become conductive, each of said coupling means responsive to the change in polarity of the collector electrode of the newly nonconductive operating transistor to supply to the base electrode of the next succeeding operating transistor a signal of a polarity and amplitude to cause said next succeeding operating transistor to become conductive, a plurality of feedback circuits, each feedback circuit comprising second nonlinear circuit means connecting the collector electrode of each individual operating transistor back to the base electrode of the immediately preceding operating transistor, said second nonlinear circuit means constructed to pass pulses of a polarity which will tend to cut off said immediately preceding operating transistor.

3. A ring-counter in accordance with claim 1 in which each stage comprises a locking transistor, each locking transistor comprising a collector electrode and a base electrode, first impedance means connecting the base electrode of the locking transistor of each stage to the collector electrode of the operating transistor of the same stage, means for connecting the collector electrode of the locking transistor of each stage to the base electrode of the operating transistor of the same stage, and means including battery source means and second impedance means for causing the locking transistor of a given stage to become conductive a predetermined time interval after the operating transistor of said given stage becomes operative, and for causing the operating transistor of said given stage to remain conductive once said locking transistor of said given stage becomes conductive.

4. In a ring-counter including a plurality of stages, each stage including an operating transistor comprising a base electrode and a collector electrode, said ring-counter being constructed to cause only one operating transistor to be conductive at a given time with the condition of conductivity being passed to succeeding operating transistors in response to each input pulse, a plurality of coupling means each individual to a given stage and connecting the collector electrode of operating transistor of said given stage to the base electrode of the next succeeding operating transistor, means for supplying input pulses simultaneously to the base electrodes of all said operating transistors to cause the conductive operating transistor to become nonconductive, the coupling means connected to the collector electrode of the newly nonconductive operating transistor and said next succeeding operating transistor responsive to the change in polarity of the collector electrode of the newly nonconductive transistor to supply to the base electrode of said next succeeding operating transistor a signal of proper polarity and amplitude to cause said next succeeding operating transistor to become conductive, each stage further comprises a locking transistor, each locking transistor including a collector electrode and a base electrode, first impedance means for connecting the base electrode of the locking transistor of each stage to the collector electrode of the operating transistor of the same stage, means for connecting the collector electrode of the locking transistor of each stage to the base electrode of the operating transistor of the same stage and means including battery source means and second impedance means for causing the locking transistor of a given stage to become conductive a predetermined time interval after the operating transistor of said given stage becomes operative, and for causing the operating transistor of said given stage to remain conductive once said locking transistor of said given stage becomes conductive.

References Cited by the Examiner

UNITED STATES PATENTS

| | | | |
|---|---|---|---|
| 2,594,336 | 4/52 | Mohr | 307—88.5 |
| 2,876,365 | 3/59 | Slusser | 307—88.5 |
| 2,957,091 | 10/60 | Page | 307—88.5 |
| 3,121,802 | 2/64 | Palmer | 307—88.5 |

OTHER REFERENCES

I, Solid State Products Inc. Bulletin D410-02, 3-60, page 12, Fig. 10.

II, Solid State Products Inc. Bulletin D420-02, 4-60, page 5, FIG. 2.

ARTHUR GAUSS, *Primary Examiner.*